US006486809B1

United States Patent
Figoli

(10) Patent No.: US 6,486,809 B1
(45) Date of Patent: Nov. 26, 2002

(54) ANALOG TO DIGITAL CONVERTER WITH CONFIGURABLE SEQUENCE CONTROLLER

(75) Inventor: David A. Figoli, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 74 days.

(21) Appl. No.: 09/585,771

(22) Filed: Jun. 2, 2000

Related U.S. Application Data

(60) Provisional application No. 60/137,934, filed on Jun. 2, 1999.

(51) Int. Cl.[7] ................................................ H03M 1/00
(52) U.S. Cl. ...................................... 341/141; 341/155
(58) Field of Search ................................ 341/141, 126, 341/155, 159, 161, 131

(56) References Cited

U.S. PATENT DOCUMENTS

| | | | | |
|---|---|---|---|---|
| 3,976,869 A | * | 8/1976 | Stella et al. ................. | 341/141 |
| 4,933,676 A | * | 6/1990 | Haunge et al. .............. | 341/141 |
| 5,168,276 A | * | 12/1992 | Huston et al. ............... | 341/141 |
| 5,172,116 A | * | 12/1992 | Noma ......................... | 341/141 |
| 5,291,197 A | * | 3/1994 | Abe ............................ | 341/141 |

* cited by examiner

*Primary Examiner*—Tuan T. Lam
(74) *Attorney, Agent, or Firm*—Gerald E. Laws; W. James Brady, III; Frederick J. Telecky, Jr.

(57) ABSTRACT

A digital system is provided with an Analog to Digital converter (ADC) that has a configuration that allows a programmable number of Auto conversions to occur on two separate and independent, but cascadeable, sequencers (or state machines). For each conversion state, the sequencer/s can be programmed to arbitrarily select any one of a set of muxed analog input channels. In addition, each conversion state has a unique result register in which the converted value is placed at completion of conversion. This ADC control system gives the capability to set up various forms of input signal sampling strategies. For example, one such strategy samples and converts the same channel multiple times allowing an over-sampling algorithm to be easily performed. By over sampling, increased resolution over traditional single sampled conversion systems can be obtained by suitable processing of the over-sampled results.

11 Claims, 9 Drawing Sheets

FIG. 7

| 15 | 14 | 13 | 12 | 11 | 10 | 9 | 8 |
|---|---|---|---|---|---|---|---|
| RESERVED | ADC MODULE S/W RESET | SUSPEND-SOFT | SUSPEND-FREE | ACQ PRE-SCALE 3 | ACQ PRE-SCALE 2 | ACQ PRE-SCALE 1 | ACQ PRE-SCALE 0 |
| R-X | RS-0 | RW-0 | RW-0 | RW-0 | RW-0 | RW-0 | RW-0 |

| 7 | 6 | 5 | 4 | 3 | 2 | 1 | 0 |
|---|---|---|---|---|---|---|---|
| CONV PRE-SCALE (CPS) | CONTINUOUS RUN | INT PRIORITY | SEQ1/2 CASCADE | CALIBRATE ENABLE | BRIDGE ENABLE | HI/LO | FSTEST ENABLE |
| RW-0 | RW-0 | RW-0 | RW-0 | RW-0 | RW-0 | RW-0 | RW-0 |

FIG. 8

| 15 | 14 | 13 | 12 | 11 | 10 | 9 | 8 |
|---|---|---|---|---|---|---|---|
| EV2 SOC ENABLE SEQ1 | RESET SEQ1 / START CALIBRATE | SOC SEQ1 | SEQ1 BUSY | INT ENA SEQ1 MODE 1 | INT ENA SEQ1 MODE 0 | INT FLAG SEQ1 | EV1 SOC ENABLE SEQ1 |
| RW-0 | RS-0 | RW-0 | RW-0 | RW-0 | RW-0 | RW-0 | RW-0 |

| 7 | 6 | 5 | 4 | 3 | 2 | 1 | 0 |
|---|---|---|---|---|---|---|---|
| EXT SOC ENABLE SEQ1 | RESET SEQ2 | SOC SEQ2 | SEQ2 BUSY | INT ENA SEQ2 MODE 1 | INT ENA SEQ2 MODE 0 | INT FLAG SEQ2 | EV2 SOC ENABLE SEQ2 |
| RW-0 | RS-0 | RW-0 | RW-0 | RW-0 | RW-0 | RW-0 | RW-0 |

FIG. 9

| 15 | 14 | 13 | 12 | 11 | 10 | 9 | 8 |
|---|---|---|---|---|---|---|---|
| RESERVED | RESERVED | RESERVED | RESERVED | RESERVED | RESERVED | RESERVED | RESERVED |
| R-x | R-x | R-x | R-x | R-x | R-x | R-x | R-x |

| 7 | 6 | 5 | 4 | 3 | 2 | 1 | 0 |
|---|---|---|---|---|---|---|---|
| RESERVED | MAXCONV2 2 | MAXCONV2 1 | MAXCONV2 0 | MAXCONV1 3 | MAXCONV1 2 | MAXCONV1 1 | MAXCONV1 0 |
| R-x | RW-0 | RW-0 | RW-0 | RW-0 | RW-0 | RW-0 | RW-0 |

FIG. 10

| 15 | 14 | 13 | 12 | 11 | 10 | 9 | 8 |
|---|---|---|---|---|---|---|---|
| RESERVED | RESERVED | RESERVED | RESERVED | SEQ COUNTER 3 | SEQ COUNTER 2 | SEQ COUNTER 1 | SEQ COUNTER 0 |
| R-x | R-x | R-x | R-x | R-0 | R-0 | R-0 | R-0 |

| 7 | 6 | 5 | 4 | 3 | 2 | 1 | 0 |
|---|---|---|---|---|---|---|---|
| SEQ2-STATE 3 | SEQ2-STATE 2 | SEQ2-STATE 1 | SEQ2-STATE 0 | SEQ1-STATE 3 | SEQ1-STATE 2 | SEQ1-STATE 1 | SEQ1-STATE 0 |
| R-0 | R-0 | R-0 | R-0 | R-0 | R-0 | R-0 | R-0 |

US 6,486,809 B1

ANALOG TO DIGITAL CONVERTER WITH CONFIGURABLE SEQUENCE CONTROLLER

This application claims priority under 35 USC §119(e)(1) of Provisional Application No. 60/137,934, filed Jun. 2, 1999 (TI-29287PS).

FIELD OF THE INVENTION

This invention generally relates to analog to digital converters (ADC), and more specifically to control of an ADC.

BACKGROUND OF THE INVENTION

Analog to digital converters are well known and are commonly used to convert an analog signal into a digital representation by periodically sampling the analog signal to form a sequence of digital values. A simple ADC generally provides a low resolution digital representation for each sample, such as an eight-bit value, for example. More complex ADCs provide higher accuracy's, such a sixteen-bit values, or higher. ADCs are often included within a digital system that includes a microprocessor or a micro controller as part of a compliment of peripheral devices. Operation of the ADC may be controlled by software executed on the associated microprocessor.

Microprocessors are general purpose processors which provide high instruction throughputs in order to execute software running thereon, and can have a wide range of processing requirements depending on the particular software applications involved. Many different types of processors are known, of which microprocessors are but one example. For example, Digital Signal Processors (DSPs) are widely used, in particular for specific applications, such as mobile processing applications and for embedded controllers. DSPs are typically configured to optimize the performance of the applications concerned and to achieve this they employ more specialized execution units and instruction sets. Particularly in applications such as mobile telecommunications, but not exclusively, it is desirable to provide ever increasing DSP performance while keeping power consumption as low as possible.

SUMMARY OF THE INVENTION

In general, and in a form of the present invention a digital system is provided with an analog to digital converter (ADC) with input multiplexor circuitry having a set of analog input terminals for receiving a plurality of analog signals. The input multiplexor is responsive to a select input. A sequence state machine is controllably connected to the input multiplexor select input, and has number of programmable states. The state machine is operable to auto-sequence a series of conversions by the ADC. Each of the programmable states can be programmed to select any one of the set of analog input terminals. A set of result registers is connected to an output of the ADC, and each result register operable to receive a conversion result from the ADC corresponding to a respective state of the sequence state machine.

According to another aspect of the present invention, a second sequence state machine is controllably connected to the input multiplexor select input and also has a number of programmable states. The second sequence state machine is also operable to auto-sequence a series of conversions by the ADC and to select any one of the set of analog input terminals. Arbitration circuitry is connected to the first sequence state machine and to the second sequence state machine and is operable to enable either the first sequence state machine or the second sequence state machine to control the ADC.

According to another aspect of the present invention, mode control circuitry is connected to the first sequence state machine and to the second sequence state machine and is operable to select a cascade mode of operation, wherein the second sequence state machine is enabled to operate in a cascade manner with the first sequence state machine.

BRIEF DESCRIPTION OF THE DRAWINGS

Particular embodiments in accordance with the invention will now be described, by way of example only, and with reference to the accompanying drawings in which like reference signs are used to denote like parts and in which the Figures relate to the digital system of FIG. 1 unless otherwise stated, and in which:

FIG. 7 illustrates a first control register for the ADC;

FIG. 8 illustrates a second control register for the ADC;

FIG. 9 illustrates a third control register for the ADC;

FIG. 10 illustrates a status register for the ADC;

Corresponding numerals and symbols in the different figures and tables refer to corresponding parts unless otherwise indicated.

DETAILED DESCRIPTION OF EMBODIMENTS OF THE INVENTION

Although the invention finds particular application to Digital Signal Processors (DSPs), implemented, for example, in an Application Specific Integrated Circuit (ASIC), it also finds application to other forms of processors. An ASIC may contain one or more megacells which each include custom designed functional circuits combined with pre-designed functional circuits provided by a design library, such as an analog to digital converter (ADC).

Figure 1:
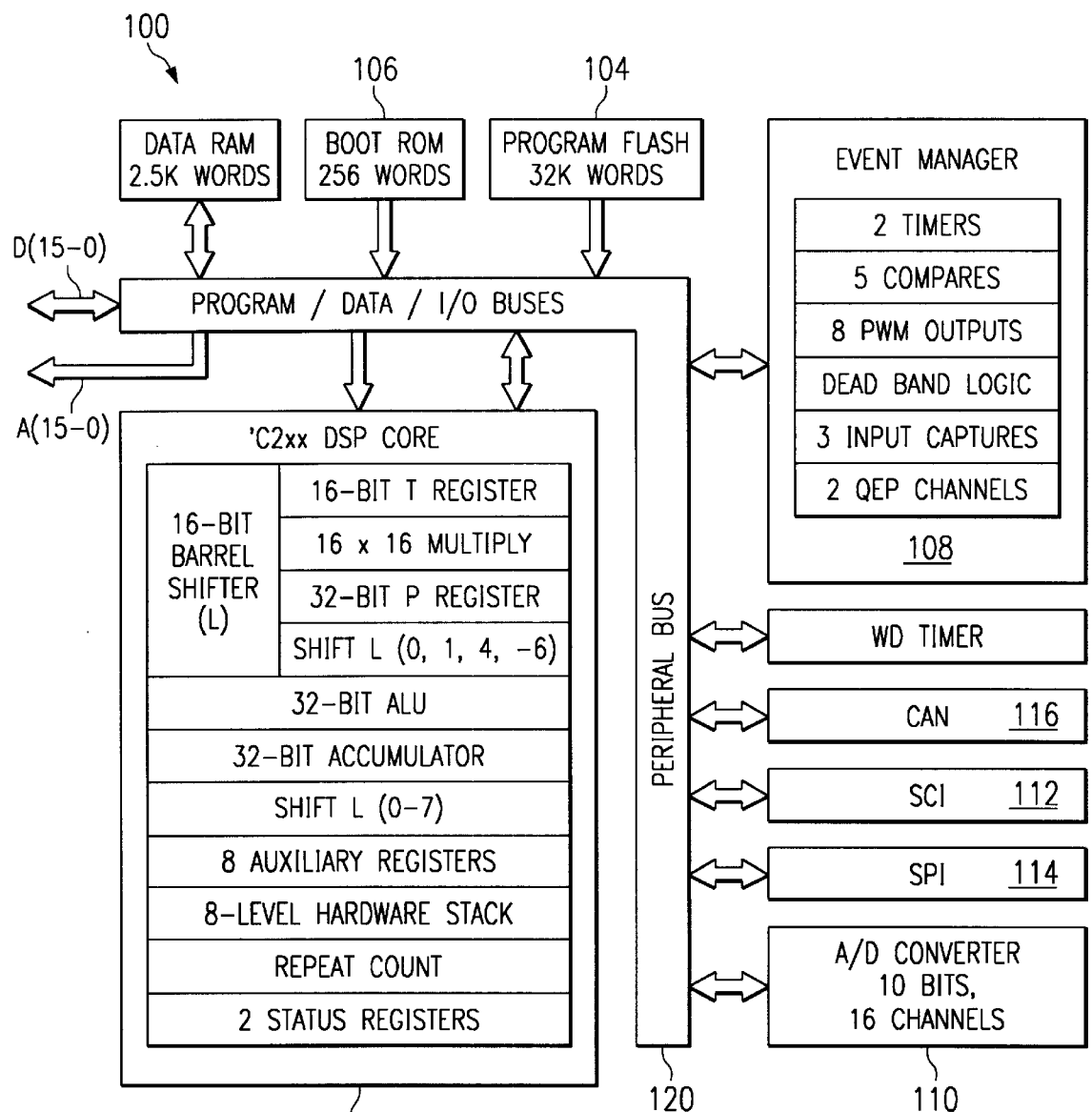
FIG. 1 is a block diagram of a digital system that includes an analog to digital converter (ADC) that is an embodiment of the present invention.

FIG. 1 is a block diagram of a digital system 100 that includes an analog to digital converter (ADC) 110 that is an embodiment of the present invention. Digital system 100 is representative of TMS320LF240x and TMS320LC240x devices, available from Texas Instruments Incorporated. The '240x devices offer the enhanced TMS320 architectural design of the 'C2xx core CPU for low-cost, low-power, high-performance processing capabilities. Several advanced peripherals, optimized for digital motor and motion control applications, have been integrated to provide a true single chip DSP controller.

In the interest of clarity, FIG. 1 only shows those portions of DSP core 102 that are relevant to an understanding of an embodiment of the present invention. Details of general construction for DSPs are well known, and may be found readily elsewhere. For example, U.S. Pat. No. 5,072,418 issued to Frederick Boutaud, et al, describes a DSP in detail. U.S. Pat. No. 5,329,471 issued to Gary Swoboda, et al, describes in detail how to test and emulate a DSP.

The '240x family offers an array of memory sizes and different peripherals tailored to meet the specific price/performance points required by various applications. Flash-based devices of up to 32K words offer a reprogrammable solution useful for applications requiring field programmability upgrades and for development and initial prototyping of applications that migrate to ROM-based devices. Flash devices and corresponding ROM devices are fully pin-to-pin compatible. Note that flash-based devices contain a 256-word boot ROM 106 to facilitate in-circuit programming.

Digital system 100 offers at least one event manager module 108 which has been optimized for digital motor control and power conversion applications. Capabilities of this module include centered- and/or edge-aligned PWM generation, programmable deadband to prevent shoot-through faults, and synchronized analog-to-digital conversion using auto-sequenced ADC 110. Devices with dual event managers enable multiple motor and/or converter control with a single '240x DSP controller.

The high performance, 10-bit ADC 110 has a minimum conversion time of 500 ns and offers up to 16 channels of analog input. The auto sequencing capability of the ADC allows a maximum of 16 conversions to take place in a single conversion session without any CPU overhead.

A serial communications interface (SCI) 112 is integrated on all devices to provide asynchronous communication to other devices in the system. For systems requiring additional communication interfaces, a 16-bit synchronous serial peripheral interface (SPI) 114 is provided. A controller area network (CAN) 116 communications module is provided that meets 2.0B specifications. To maximize device flexibility, functional pins are also configurable as general purpose inputs/outputs (GPIO). Program/data/I/O buses 120 connect DSP core 102 to the various peripheral devices described above.

To streamline development time, JTAG-compliant scan-based emulation has been integrated into all devices. This provides non-intrusive real-time capabilities required to debug digital control systems.

Figure 2:
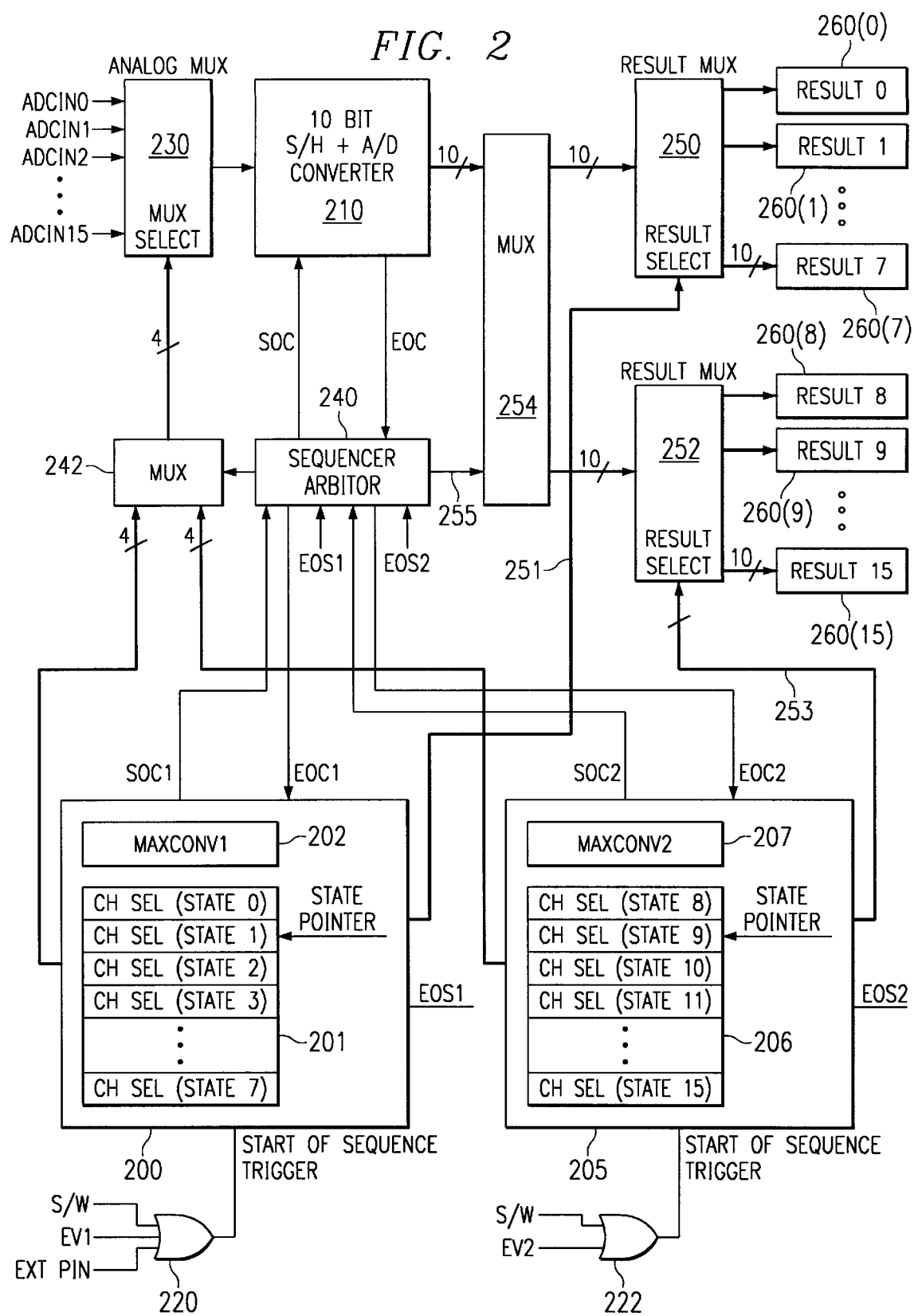
FIG. 2 is a block diagram of the auto-sequenced ADC of FIG. 1 configured to operate in dual mode.

FIG. 2 is a block diagram of the auto-sequenced ADC 110 of FIG. 1 configured to operate in dual mode. The ADC Sequencer consists of two independent eight state sequencers 200, 205 that can also be cascaded together to form one sixteen state sequencer. The number of states determine the number of possible auto-conversions. The states are embodied by a set of eight channel select entries contained in channel select sequencing (CHSELSEQ) control registers 201, 206, respectively. A maximum number of conversions register 202, 207, respectively indicate how many of the possible eight states are to be traversed each time a conversion sequence is performed.

The core of the ADC system is a 10-bit A/D 210 with a total conversion time of 480 nS, including sample and hold time (S/H). A conversion is started in response to a start of conversion signal SQC from arbitor 240. At the completion of a conversion, end of conversion signal EOC is asserted to arbitor 240 and then relayed to the active sequencer via signal EOC1 or EOC2. Trigger signals are received by trigger circuits 220, 222 and provide a trigger to each sequencer to start an auto-conversion sequence. Trigger signals can come from a number of sources, including a software initiated signal S/W, an external signal pin and event timers EV1, EV2, for example.

Analog multiplexer 230 receives up to sixteen analog input signals ADCIN(0–15) and provides a selected on of them to the sample/hold input of A/D 210. Analog mux 230 has select inputs that are connected to receive select signals via multiplexer 242 from sequencers 200, 205. Sequencer arbitor 240 determines which sequencer is in control, if both have received a triggering signal, by monitoring a start of conversion signal SOC1 from sequencer 200 and a start of conversion signal SOC2 from sequencer 205. Arbitor 240 controls mux 242 in accordance to which sequencer is deemed to be in control. Once arbitor 240 selects one or the other sequencer, the selected sequencer remains in control until that sequencer asserts an end of sequence (EOS) signal EOS1, EOS2.

Result multiplexers 250, 252 receive a digitized sample from A/D 210 via mux 254 and direct the digitized sample to one of result registers 260(0–15) in response to select signals 251, 253 from respective sequencers and select signal 255 from arbitor 240.

Figure 3:
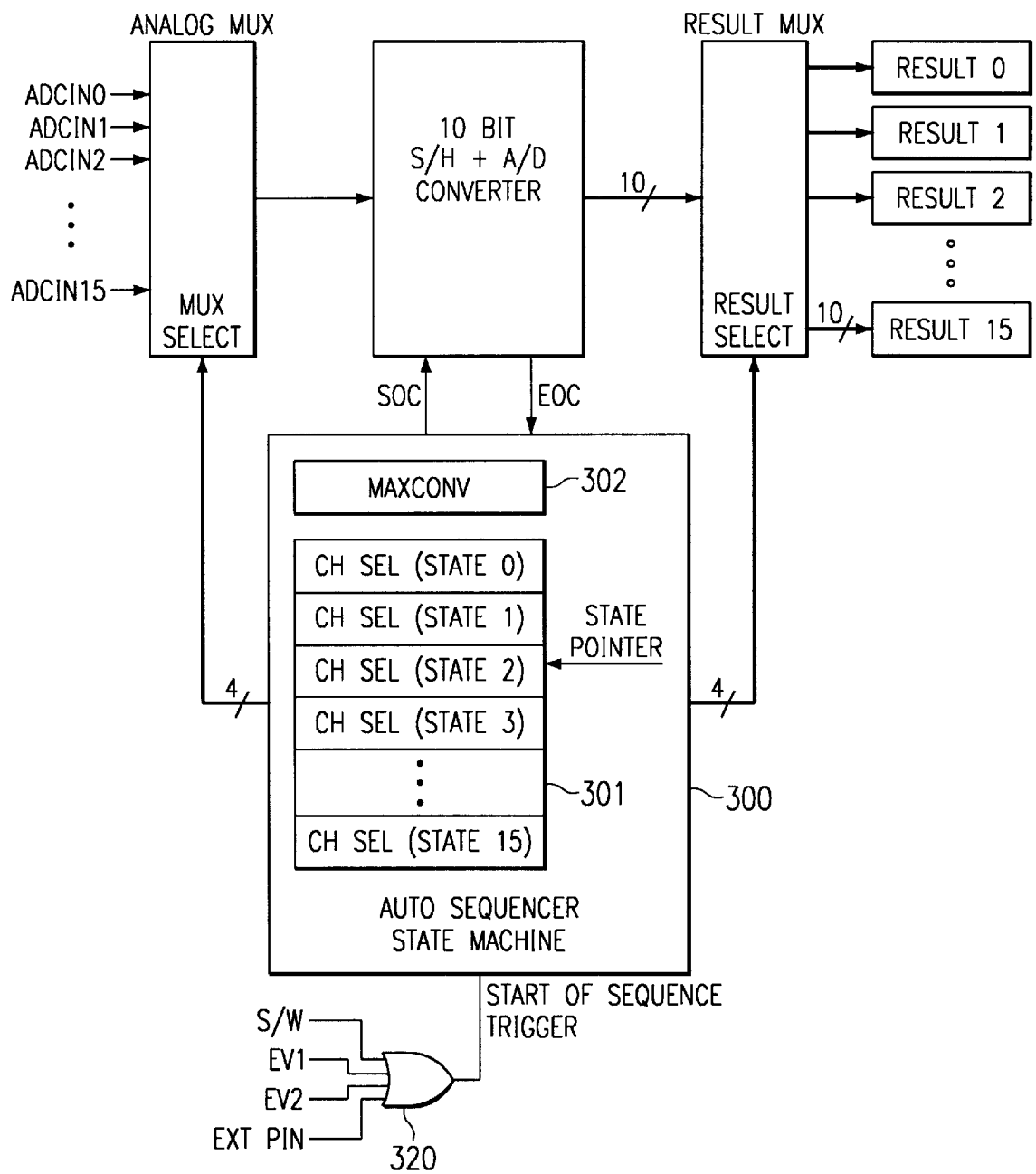
FIG. 3 is a block diagram of the auto-sequenced ADC of FIG. 1 configured to operate in cascaded mode.

FIG. 3 is a block diagram of the auto-sequenced ADC of FIG. 1 configured to operate in cascaded mode. In this mode, sequencers 200 and 205 appear to be a single sequencer 300 that has sixteen possible states, as defined by sixteen channel select entries 301. In this mode, max conversion register 302 can be loaded to allow up to sixteen conversions. Trigger circuitry 320 is responsive to all of the trigger signals S/W, EV1, EV2, and Ext pin.

Figure 4:
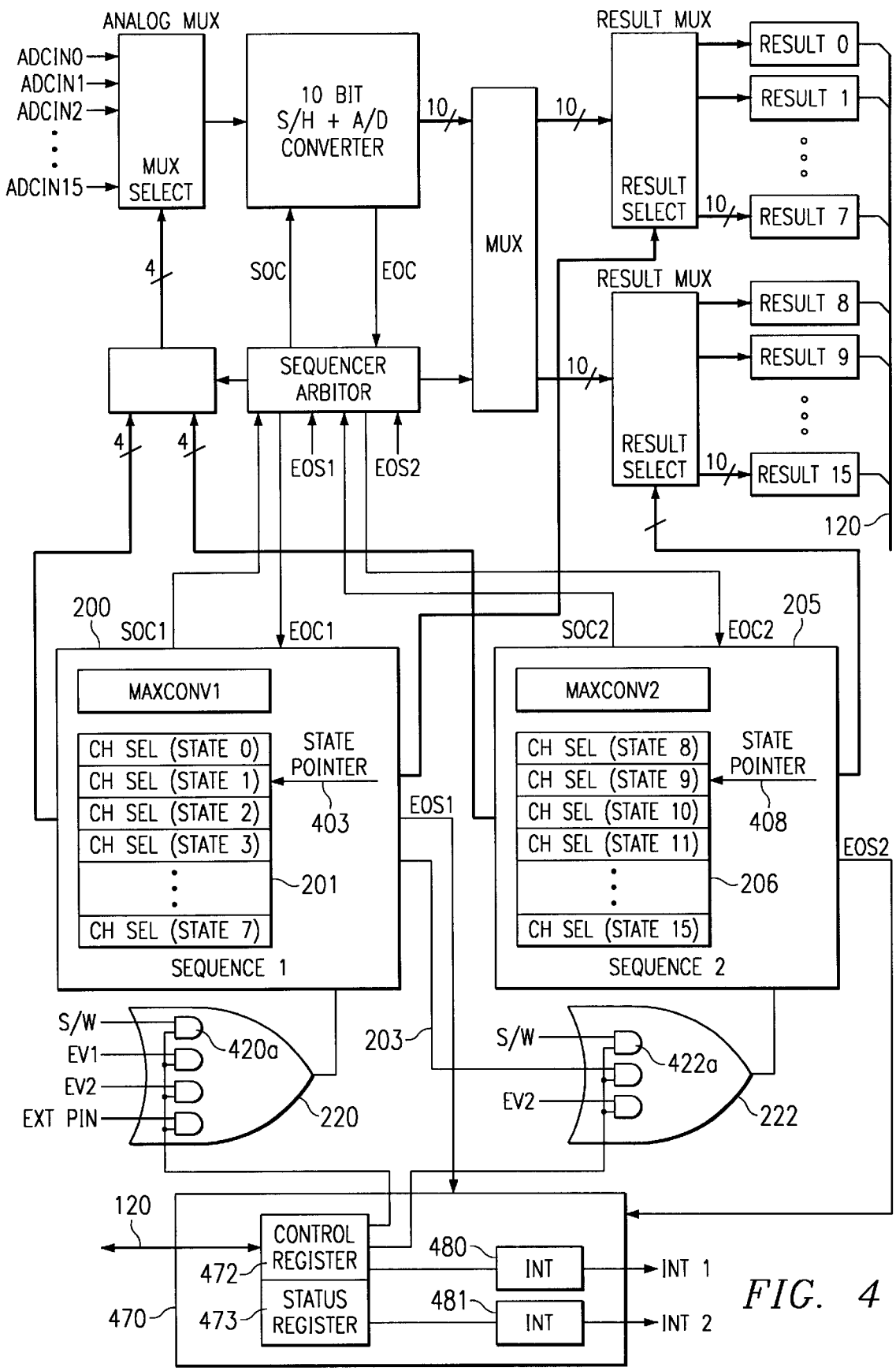
FIG. 4 is a block diagram of the ADC of FIG. 1, illustrating mode control circuitry in more detail.

In cascade mode, arbitor 240 and mux 242 are essentially transparent since sequencer 205 is only activated if sequencer 200 traverses all eight states. This can be better understood with reference to FIG. 4, which illustrates mode control circuitry 470 in more detail. A set of control registers 472 can be read and written by DSP core 102 via peripheral bus 120. Details of these registers will be described later. Each trigger circuit 220, 222 has trigger enable circuitry, such as AND gate 420a, 422a associated with each trigger signal. Thus, each trigger signal can be enabled or blocked under control of DSP core 102. When configured in cascade mode, only trigger signals to sequencer 200 are enabled.

When sequencer 200 completes all eight states, signal 203 is asserted to trigger sequencer 205. Otherwise, all trigger signals to trigger circuit 222 are blocked.

Each Sequencer has a set of trigger inputs that can be enabled/disabled. The valid input triggers for SEQ1, SEQ2 & Cascaded SEQ are indicated in Table 1.

TABLE 1

Valid Input Triggers for SEQ1, SEQ2 and Cascaded SEQ

| SEQ1 (sequencer 1) | SEQ2 (sequencer 2) | Cascaded SEQ |
| --- | --- | --- |
| Software trigger (S/W SOC) | Software trigger (S/W SOC) | Software trigger (S/W SOC) |
| Event Manager 1 (EV1 SOC) | Event Manager 2 (EV2 SOC) | Event Manager 1 (EV1 SOC) |
| External SOC pin (EXT SOC) | | Event Manager 2 (EV2 SOC) |
| | | External SOC pin (EXT SOC) |

A SOC Trigger can initiate an Auto-conversion sequence whenever a Sequencer is in "idle" state. An Idle state is either Conv00 prior to receiving a trigger, or any state which the Sequencer lands on at completion of a conversion sequence, i.e. when SEQCNTR has reached a count of zero.

If an SOC Trigger occurs while a current conversion sequence is underway it sets the SOC SEQn bit in control register set 472. If then another SOC Trigger occurs, it is lost, i.e. when the SOC SEQn bit is already set (SOC pending) subsequent triggers will be ignored.

Once triggered, the sequencer cannot be stopped/halted in mid sequence, software operating on DSP core 102 must wait until an End of Sequence (EOS) or initiate a Sequencer reset, which brings the sequencer immediately back to the idle start state. (Conv00 for SEQ1 & Cascaded cases, Conv08 for SEQ2).

When SEQ1/2 are used in cascaded mode, triggers going to SEQ2 are ignored, while SEQ1 triggers are active. In effect, Cascaded mode can be viewed equivalently as SEQ1 with sixteen states instead of eight.

Interrupt circuitry 480, 481 will be described in more detail later.

In both dual mode and cascade mode, the ADC has the ability to Auto-sequence a series of conversions, each of which has the choice of selecting any one of the sixteen input channels available through the analog mux. Once converted the selected channel value is stored in the appropriate Result register. With this system it is therefore possible to sample the same channel multiple times allowing the user to perform "Over-sampling" algorithms, whereby increased resolution over traditional single sampled conversion can be derived.

The sequencer operation of both the dual eight state mode or cascaded sixteen state modes are very similar. Table 2 summarizes a few exceptions.

For convenience, the Sequencer States will be subsequently referred to as: Conv00–Conv07 for sequencer 1; Conv08–Conv15 for sequencer 2; and Conv00–Conv15 for cascaded mode.

Operation of the sequencers will now be described in more detail. The following description of operation will be for eight state Sequencer 200. In this mode Sequencer 200 can "Auto-sequence" up to eight conversions of any channel in a single sequencing session. The result of each conversion is stored in sixteen word result buffer 260(0–7), This buffer is filled from lowest to highest address. The analog input channel selected for each sequenced conversion is defined by four-bit fields, Convnn, in the CHSELSEQ control registers 201, which will be described with reference to FIG. 11.

The number of conversions is controlled by MAXCONV1 202 which is automatically loaded into the Sequencing Counter, which is part of a status register 473, bits 11-8, at the start of an auto-sequenced conversion session. Refer to FIG. 10 for a description of the status register. MAXCONV1 can have a value ranging from 0–7. The status register also contains a four-bit state counter for each sequencer; the state counter of an active sequencer is incremented each time the sequence counter is decremented. The current value of each state counter is interpreted as state pointer 403, 407 and is used to select the current channel selection entry from the CHSELSEQ control registers. SEQCNTR counts down from it's loaded value as the Sequencer proceeds starting from state Conv00 and continues sequentially (Conv01, Conv02,..etc) until SEQCNTR has reached zero. The number of conversions completed during an Auto-sequencing session is equal to MAXCONV1+1.

Each of the four-bit channel selection fields (Convnn) can be any value (i.e. channel), therefore the same channel may be selected multiple times and in any desired order.

TABLE 2

Comparison of Operating Modes, Single & Cascaded.

| Feature | Single 8 state Sequencer #1 | Single 8 state Sequencer #2 | Cascaded 16 state Sequencer (1 & 2) |
| --- | --- | --- | --- |
| Start of conversion triggers | EV1, EXT, S/W | EV2, S/W | EV1, EV2, EXT, S/W |
| Maximum # of Auto-conversions (i.e. sequence length) | 8 | 8 | 16 |
| Auto-Stop at end of Sequence (EOS) | Yes | Yes | Yes |
| Arbitration priority | High | Low | Not applicable |
| ADC conversion Result reg. locations | 0 → 7 | 8 → 15 | 0 → 15 |
| CHSELSEQn bit field assignment | Conv00 → Conv07 | Conv08 → Conv15 | Conv00 → Conv15 |

As an example, if seven conversions are desired from Sequencer 1, i.e. Channels 2, 3, 2, 3, 6, 7, 12, as the auto-sequenced session, then MAXCONV1 is set to 6 and the Channel select sequencing control registers (CHSELSEQn) are set as shown in Table 3.

TABLE 3

Example CHSELSEQ Control Register Entries

| Bits 15–12 | Bits 11–8 | Bits 7–4 | Bits 3–0 | |
|---|---|---|---|---|
| 3 | 2 | 3 | 2 | CHSELSEQ1 |
| x | 12 | 7 | 6 | CHSELSEQ2 |
| x | x | x | x | CHSELSEQ3 |
| x | x | x | x | CHSELSEQ4 |

Note: Values are in decimal, and x = don't care

Once SEQCNTR reaches zero, it may automatically start over again by being reloaded with the original value in MAXCONV1, or remain in an inactive state depending on the Continuous Run bit in one of control registers 472, ADC Control Register 1 (ADCCTRL1).

The same example above also applies to Sequencer 2 and to cascaded mode with a sixteen state sequencer with differences outlined in Table 2.

In addition to the above described "basic operation", a Sequencer (i.e. Sequencer 1,2 or Cascaded) can be operated in a "Stop/Start" fashion which is synchronized to multiple start of conversion (SOC) triggers separated in time. This operating mode is nothing more than the previous example, but with the Sequencer allowed to be re-triggered without being reset to the initial state Conv00, once it has finished its' first sequence.

Figure 5:
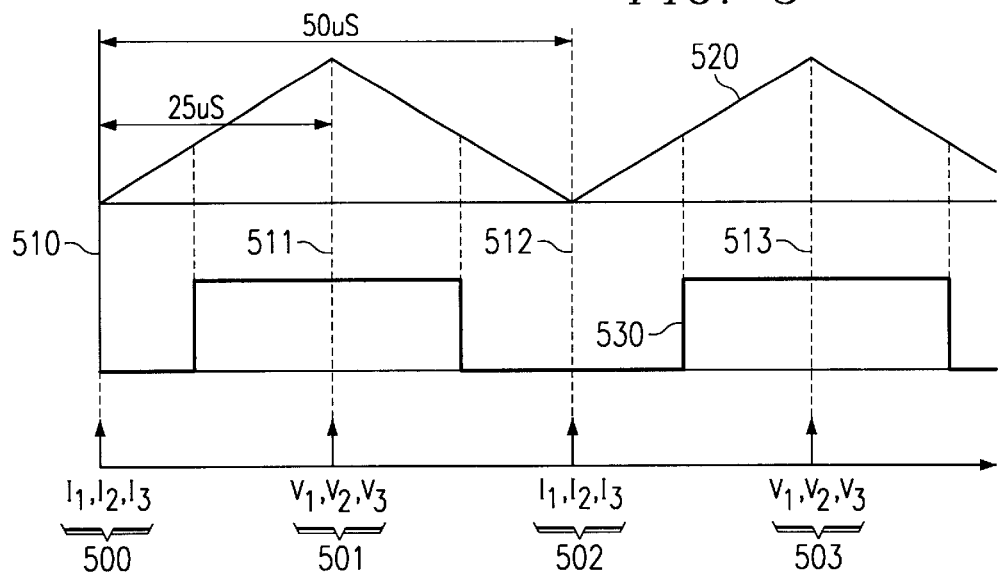
FIG. 5 is a timing diagram illustrating an example of event manager triggers used to start the sequencer of FIGS. 2–4.

FIG. 5 is a timing diagram illustrating an example of event manager triggers used to start the sequencer. Three auto-conversions are to be performed in response to each assertion of a trigger signal, such as $I_1,I_2,I_3$ indicated as 500 and 502, $V_1,V_2,V_3$ indicated as 501, 503, for example. Trigger events 510–513 are separated in time by 25 uS, for example, and are provided by Event Manager 108. Trace 520 represents operation of an event timer in event manager 108 that asserts the EV1 trigger signal at each inflection point. Trace 530 represents a pulse width modulated output signal generated by event manager 108 that controls an external device to produce voltage and current signals that are to be samples. The triggers may also be any SOC from EV1, EXT, or S/W. The same trigger source may occur twice to satisfy the dual trigger requirement of this example.

In this example, MAXCONV1 is set to 2 and the ADC input (I/P) Channel select sequencing control registers are set as indicated in Table 4.

TABLE 4

ADC Input (I/P) Channel Select Sequencing Control Registers

| Bits 15–12 | Bits 11–8 | Bits 7–4 | Bits 3–0 | |
|---|---|---|---|---|
| $V_1$ | $I_3$ | $I_2$ | $I_1$ | CHSELSEQ1 |
| x | x | $V_3$ | $V_2$ | CHSELSEQ2 |
| x | x | x | x | CHSELSEQ3 |
| x | x | x | x | CHSELSEQ4 |

Once reset and initialized, Sequencer 1 waits for a trigger. When trigger event 510 occurs, three conversions with channel select values of: Conv00 ($I_1$), Conv01 ($I_2$), & Conv02 ($I_3$) are performed. Sequencer 1 then waits at the current state for another trigger. 25 uS later when trigger 511 arrives, another three conversions occur, with channel select values of Conv03 ($V_1$), Conv04 ($V_2$), & Conv05 ($V_3$).

In both trigger cases the value of MAXCONV1 is automatically loaded into SEQ1CNTR. If a different number of conversions are required at the second trigger point, software operating on DSP core 102 must at some appropriate time before the arrival of the second trigger change by the value of MAXCONV1, otherwise the current (originally initialized) value will be reused. The handling of this process can be made easier by utilizing the Sequencer Interrupts to prompt a software interrupt service routine (ISR) to change the value of MAXCONVn at the appropriate time. The Interrupt operation modes are described in later.

At end of second Auto-conversion session the ADC result registers have values indicated in Table 5.

TABLE 5

Auto-Conversion Session ADC Result Registers Values

| Buffer Register | ADC Conversion result Buffer |
|---|---|
| RESULT0 | $I_1$ |
| RESULT1 | $I_2$ |
| RESULT2 | $I_3$ |
| RESULT3 | $V_1$ |
| RESULT4 | $V_2$ |
| RESULT5 | $V_3$ |
| RESULT6 | x |
| RESULT7 | x |
| RESULT8 | x |
| RESULT9 | x |
| RESULT10 | x |
| RESULT11 | x |
| RESULT12 | x |
| RESULT13 | x |
| RESULT14 | x |
| RESULT15 | x |

Also Sequencer 1 remains "waiting for another trigger" at the current state. At this stage, a software control program can decide to reset the sequencer to state Conv00 and repeat again the same sequence at trigger points 512, 513.

Referring again to FIG. 4, the Sequencer can generate interrupts under two operating modes using interrupt circuits 480, 481 under control of mode bits located in control registers 472, as described in Table 6.

TABLE 6

Sequencer Generated Interrupts

| ModeBit 1 | ModeBit 0 | Operation description |
|---|---|---|
| 0 | 0 | Interrupt is Disabled |
| 0 | 1 | Interrupt enable Mode 1 |
| | | Int requested immediate on every INT flag set |
| 1 | 0 | Interrupt enable Mode 2 |
| | | Int requested only if INT flag is already set, if clear, INT flag is set and INT request is suppressed. |
| | | (This mode allows Int requests to be generated every $2^{nd}$ time an EOS occurs) |
| 1 | 1 | Reserved |

Figure 6:
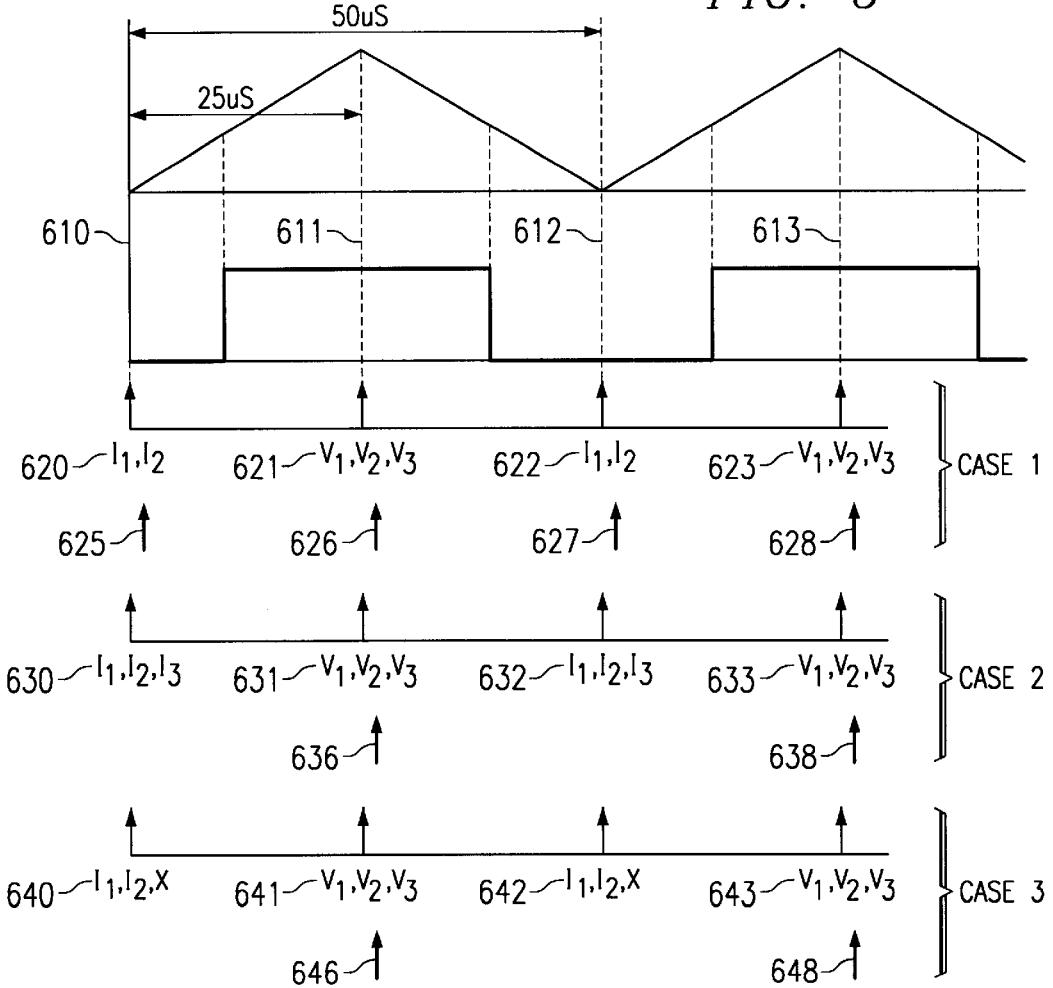
FIG. 6 illustrates several sampling sequences using the triggers of FIG. 5.

FIG. 6 illustrates several sampling sequences using the triggers of FIG. 5. Variation on the previous example can be used to show how the Interrupt modes are useful under different operating conditions.

In case 1, there is a first sequence 620 with a number of samples that is different from a second sequence 621 number of samples. In step 1, Interrupt mode 1 is selected to cause an interrupt to occur at every EOS, indicated at 625–628. In step 2, the sequencer is initialized with MAXCONVn=1 for I₁,I₂ sampling sequence 620. In step 3, an ISR responsive to interrupt 625 reinitializes the sequencer with MAXCONVn=2, for V₁, V₂, V₃ sampling sequence 621. In step 4, the ISR responsive to interrupt 626 reinitializes the sequencer to MAXCONVn=1, for I₁,I₂ sampling sequence 622 and values I₁, I₂,V₁, V₂, V₃ are read from ADC result registers 260(0–4). Steps 3 and 4 are then repeated.

In case 2, there is a first sequence 630 with a number of samples that is the same a second sequence 631 number of samples. In step 1, Interrupt mode 2 is selected to cause an interrupt to occur at every other EOS, indicated at 636, 638. In step 2, the sequencer is initialized with MAXCONVn=2 for I₁, I₂, I₃ sampling sequence 630 and for V₁, V₂, V₃ sampling sequence 631. In step 3, an ISR responsive to interrupt 636 reads values I₁, I₂, I₃, V₁, V₂, V₃from ADC result registers 260(0–5). Step 3 is then repeated.

In case 3, there is a first sequence 640 with a number of samples that is the same a second sequence 641 number of samples. In step 1, Interrupt mode 2 is selected to cause an interrupt to occur at every other EOS, indicated at 646, 648. In step 2, the sequencer is initialized with MAXCONVn=2 for I₁, I₂, x sampling sequence 640 and for V₁, V₂, V₃ sampling sequence 641. In step 3, an ISR responsive to interrupt 646 reads values I₁, I₂, x, V₁, V₂, V₃ from ADC result registers 260(0–5). Step 3 is then repeated. In this case, third I sample (I₃) is a dummy sample, and is not really required, however to minimize ISR overhead & CPU intervention, advantage is taken of the "every other" Interrupt request feature of Mode 2.

FIG. 7 illustrates a first control register for the ADC located in control register set 472, referred to as ADC Control Register 1 (ADCTRL1). This register is memory mapped at address offset 70A0h. Table 7 describes each bit of ADCTRL1.

TABLE 7

ADCTRL1 Bit Description

| | |
|---|---|
| Bit 14 | Bits 14: ADC Module S/W Reset: This bit causes a master reset on the entire ADC module. All Register bits and Sequencer state machines are reset to the initial state as occurs when the device reset pin is being pulled low or after a Power on Reset.<br>0-No effect<br>1-Resets entire ADC module. Bit is then set back to 0 by ADC logic |
| Bits 13, 12 | Soft & Free bits: These bits determine what occurs when an emulation suspend occurs (due to the debugger hitting a breakpoint for example). The peripheral can continue what ever it is doing (Free run mode) or if in stop mode it can either stop immediately or stop when the current operation (in the case of an ADC the current conversion) has completed.<br>Soft    Free<br>0        0        Immediate stop on suspend.<br>1        0        Complete current conversion before stopping<br>x        1        Free run, continue operation regardless of suspend |
| Bits 11-8 | Acquisition time window - Pre SCALE (3-0): These bits define the ADC clock prescale factor applied to the Acquisition portion of the conversion. The prescale values are defined in Table 8. |
| Bit 7 | Conversion Clock Pre SCALE: This bit defines the ADC conversion logic clock prescale.<br>0 - CLKIN/1: Tclk = 1/CLKIN, e.g. for CLKIN = 30 MHz, Tclk = 33nS<br>1 - CLKIN/2: Tclk = 2 × (1/CLKIN), e.g. for CLKIN = 30 MHz, Tclk = 66nS |
| Bit 6 | Continuous RUN: This bit puts the Sequencer into continuous conversion mode. This bit can be written while a current conversion sequence is active. This bit will take effect at the end of the current conversion sequence, i.e. S/W can set/clear this bit up until just before End of Sequence (EOS) has occurred for valid action to be taken.<br>0 - Sequencer stops after reaching EOS.<br>1 - Continuous conversion enabled, i.e. after reaching EOS, the sequencer restarts from the start, i.e. from State Conv00 for SEQ1 & Cascaded & Conv08 for SEQ2 only. |
| Bit 5 | INT PRI: ADC interrupt request priority.<br>1 - Low Priority<br>0 - High Priority |
| Bit 4 | SEQ1/2 Cascaded: Cascade Sequencers 1 & 2. This makes Sequencer 1 a single 16 state sequencer.<br>0 - Dual Sequencer mode (Separate SEQ1 & SEQ2)<br>1 - Cascaded mode. (One single 16 state SEQ) |
| Bit 3 | Calibration Enable: When set to 1, this bit disables the input channel multiplexor, and sets the calibration reference selected by the bits HILO and BRIDGE_EN to the ADC core inputs. When<br>this bit is set to 1 a calibration conversion can be started by setting bit 14, ADC Control 2 reg "Start Cal" to 1 If Start Cal bit is already set to 1, then the conversion is immediately started when Calibration Enable is 1. Note Calibration Enable should not be set to 1 if FSTEST = 1<br>0 - Calibration mode Disabled<br>1 - Calibration mode Enabled |
| Bit 2 | Bridge Enable: Together with the HILO bit, allows a reference voltage to be converted in Calibration mode. See HILO description for Reference voltage selections during Calibration.<br>0 - Full reference voltage is applied to the ADC input<br>1 - A reference mid-point voltage is applied to the ADC input |
| Bit 1 | HI/LO: When the fail self test is enabled (FSTEST = 1), this bit defines the test voltage to be connected with the pin. In calibration mode, this bit defines the reference source polarity<br>0 - $V_{REFLO}$ is used as pre-charge value at ADC input<br>1 - $V_{REFHL}$ is used as pre-charge value at ADC input |
| Bit 0 | FSTEST Enable: Fail Self-Test function Enable<br>0 - Fail self-test mode Disabled<br>1 - Fail self-test mode Enabled |

TABLE 8

Prescale Values

| # | Acq PS3 | Acq PS2 | Acq PS1 | Acq PS0 | Prescaler (divide by) | Acquisition Time window | Source Z (CPS) = 0 (ohms) | Source Z (CPS) = 1 (ohms) |
|---|---|---|---|---|---|---|---|---|
| 0 | 0 | 0 | 0 | 0 | 1 | 2 × Tclk | 67 | 385 |
| 1 | 0 | 0 | 0 | 1 | 2 | 4 × Tclk | 385 | 1020 |
| 2 | 0 | 0 | 1 | 0 | 3 | 6 × Tclk | 702 | 1655 |
| 3 | 0 | 0 | 1 | 1 | 4 | 8 × Tclk | 1020 | 2290 |
| 4 | 0 | 1 | 0 | 0 | 5 | 10 × Tclk | 1337 | 2925 |
| 5 | 0 | 1 | 0 | 1 | 6 | 12 × Tclk | 1655 | 3560 |
| 6 | 0 | 1 | 1 | 0 | 7 | 14 × Tclk | 1972 | 4194 |
| 7 | 0 | 1 | 1 | 1 | 8 | 16 × Tclk | 2290 | 4829 |
| 8 | 1 | 0 | 0 | 0 | 9 | 18 × Tclk | 2607 | 5464 |
| 9 | 1 | 0 | 0 | 1 | 10 | 20 × Tclk | 2925 | 6099 |
| A | 1 | 0 | 1 | 0 | 11 | 22 × Tclk | 3242 | 6734 |
| B | 1 | 0 | 1 | 1 | 12 | 24 × Tclk | 3560 | 7369 |
| C | 1 | 1 | 0 | 0 | 13 | 26 × Tclk | 3877 | 8004 |
| D | 1 | 1 | 0 | 1 | 14 | 28 × Tclk | 4194 | 8639 |
| E | 1 | 1 | 1 | 0 | 15 | 30 × Tclk | 4512 | 9274 |
| F | 1 | 1 | 1 | 1 | 16 | 32 × Tclk | 4829 | 9909 |

FIG. 8 illustrates a second control register for the ADC located in register set 472, referred to as ADC Control Register 2 (ADCTRL2). dress offset is 70A1h. Its' bits are described in Table 9.

TABLE 9

ADCCTLR2 Bit Descriptions

| | |
|---|---|
| Bit 15 | EV2 SOC Enable for SEQ1 Note: This bit is active only in Cascaded mode: Setting this bit allows Sequencer 1 to be started by an Event Manager 2 signal. The Event Manager can be programmed to start a conversion on various events. |
| Bit 14 | Reset Sequencer/Start Cal: Case 1: Calibration Enable (bit 3 of ADCCNTL1) = 0<br>Writing a 1 to this bit will reset the sequencer immediately to an initial "pre-triggered" state, i.e. waiting for a trigger at Conv00. A currently active conversion sequence will be aborted.<br>0 - No action.<br>1 - Immediately reset Sequencer to state Conv00<br>Case 2: Calibration Enable (bit 3 of ADCCNTL1) = 1<br>Writing a 1 to this bit will begin the Converter Calibration process.<br>0 - no action<br>1 - Immediately Start Calibration process |
| Bit 13 | Start of conversion (SOC) trigger for Sequencer 1 (SEQ1)<br>This bit can be Set by the following triggers:<br>S/W - Software writing of 1 to this bit<br>EV1 - Event Manager 1<br>EV2 - Event Manager 2 (only in Cascaded mode)<br>EXT - External pin i.e. the ADCSOC pin.<br>When a trigger occurs, there are 3 possibilities:<br>Case 1: SEQ1 idle & SOC bit Clear: SEQ1 starts immediately (under arbitor control) and Bit is cleared, allowing for any "pending" trigger requests.<br>Case 2: SEQ1 busy & SOC bit Clear: Bit is set signifying a trigger request is pending. When SEQ1 finally starts, this bit will be cleared.<br>Case 3: SEQ1 busy & SOC bit Set: Any trigger occurring in this case will be ignored (lost).<br>0 - Clears a Pending SOC trigger.<br>Note: If Sequencer has already started, this bit will automatically be cleared, and hence writing a zero will have no effect, i.e. an already started Sequencer cannot be stopped by clearing this bit.<br>1 - S/W trigger - Start SEQ1 from currently stopped position (i.e. Idle mode) |
| Bit 12 | SEQ1 Busy: This bit is set to a one whilst the ADC auto conversion sequence is in progress. It is cleared when the conversion sequence is complete.<br>0 - Sequencer is Idle, i.e. waiting for trigger<br>1 - Conversion sequence is in progress |
| Bit 11, 10 | Interrupt ENABLE Mode control - SEQ1<br>0 0 Interrupt is Disabled<br>0 1 Interrupt enable Mode 1: Int requested immediate on INT1 flag set<br>1 0 Interrupt enable Mode 2: Int requested only if INT1 flag is already set, if clear, INT1 flag is set and INT request is suppressed. This mode allows Int requests to be generated every $2^{nd}$ time an EOS occurs<br>1 1 reserved |
| Bit 9 | INT FLAG SEQ1. ADC interrupt flag bit for SEQ1. This bit indicates whether an interrupt event has occurred or not. Writing 1 to ADCINTFLAG will clear this bit. The flag, along with the interrupt request to the interrupt controller, is automatically cleared when the peripheral receives a peripheral interrupt acknowledge.<br>0 - No interrupt event<br>1 - An interrupt event has occurred. |

TABLE 9-continued

ADCCTLR2 Bit Descriptions

| | |
|---|---|
| Bit 8 | EV1 SOC Enable - SEQ1. Event manager 1 SOC mask bit: Setting this bit allows SEQ1 to be started by Event Manager 1 trigger. The Event Manager can be programmed to start a conversion on various events. See EV for details. |
| Bit 7 | EXT SOC Enable - SEQ1. External signal; start of conversion bit: Setting this bit enables an ADC Auto-conversion sequence to be started by a signal from the ADCSOC device pin. |
| Bit 6 | Reset SEQ2. Writing a 1 to this bit will reset the sequencer immediately to an initial "pre-triggered" state, i.e. waiting for a trigger at Conv08. A currently active conversion sequence will be aborted.<br>0 - No action<br>1 - Immediately reset Sequencer 2 (SEQ2) to state Conv08 |
| Bit 7 | Start of conversion (SOC) trigger for Sequencer 2 (SEQ2) Only applicable in Dual Sequencer mode, ignored in Cascaded mode: This bit can be Set by the following triggers:<br>S/W - Software writing of 1 to this bit<br>EV2 - Event Manager 2<br>When a trigger occurs, there are 3 possibilities:<br>Case 1: SEQ2 idle & SOC bit Clear: SEQ2 starts immediately (under arbitor control) and Bit is cleared, allowing for any "pending" trigger requests.<br>Case 2: SEQ2 busy & SOC bit Clear: Bit is set signifying a trigger request is pending. When SEQ2 finally starts, this bit will be cleared.<br>Case 3: SEQ2 busy & SOC bit Set: Any trigger occurring in this case will be ignored (lost)<br>0 - Clears a Pending SOC trigger.<br>Note: If Sequencer has already started, this bit will automatically be cleared, and hence writing a zero will have no effect, i.e. an already started Sequencer cannot be stopped by clearing this bit.<br>1 - S/W trigger - Start SEQ1 from currently stopped position (i.e. Idle mode) |
| Bit 4 | Sequencer 2 (SEQ2) Busy: This bit is set to a one whilst the ADC auto conversion sequence is in progress. It is cleared when the conversion sequence is complete.<br>0 - Sequencer is Idle, i.e. waiting for trigger<br>1 - Conversion sequence is in progress |
| Bit 3, 2 | Interrupt ENABLE Mode control SEQ2, same as bits 11, 10 |
| Bit 1 | INT FLAG SEQ2. ADC interrupt flag bit for SEQ2: same as bit 9 |
| Bit 0 | EV2 SOC Enable for SEQ2: Setting this bit allows Sequencer 2 to be started by an Event Manager 2 signal. The Event Manager can be programmed to start a conversion on various events. |

FIG. 9 illustrates a third control register for the ADC located in register set 472, referred to as ADC Control Register 3 (ADCTRL3), with an address offset of 70A2h. There are two four-bit fields and their operation varies according to the Sequencer and Dual/Cascaded modes, as summarized in Table 10.

TABLE 10

Maximum Number of Auto-Conversions

| Value | SEQ1 | SEQ2 | Cascaded |
|---|---|---|---|
| initial state | Conv00 | Conv08 | Conv00 |
| end state | Conv07 | Conv15 | Conv15 |
| max value | 7 | 7 | 15 |
| max value + 1 | 8 | 8 | 16 |

This register contains the number of conversions executed during an Auto-conversion session. An Auto-conversion session always starts with the initial state and continues sequentially until the end state if allowed, i.e. if MAXCONVn=max value, the Conversion result buffer is filled in sequential order also. Any number of conversions between 1 and max value +1 can be programmed for a session. For example: if only 5 conversions are required, then MAXCONVn is set to 0100b. For dual mode SEQ1 an Cascaded Mode, the sequencer goes from Conv00 to Conv04, and the five conversion results are stored in the registers Result 00–Result 04 of the Conversion result Buffer. However, for dual mode SEQ2, the sequencer goes from Conv08 to Conv11, and the five conversion results are stored in the registers Result 08–Result 12 of the Conversion result Buffer.

If a value for MAXCONV is chosen which is greater than seven for the Dual Sequencer mode, then SEQ CNTR will continue counting past seven causing the Sequencer to "wrap-around" to Conv00 (Conv08 for SEQ2) and continue counting. Note: If used correctly this operating mode can be used as a feature and may be considered useful.

FIG. 10 illustrates status register 473 for the ADC in more detail. The SEQ CNTR four-bit status field is used by both SEQ1, SEQ2 & Cascaded sequencer. At the start of an Auto-sequenced session, SEQ CNTR is loaded with the value from MAXCONVn. The SEQ CNTR can be read at any time during the count-down process to check status of the Sequencer. This value together with the SEQ1 & SEQ2 Busy bits uniquely identifies the progress or state of the active sequencer at any point in time.

Figure 11:
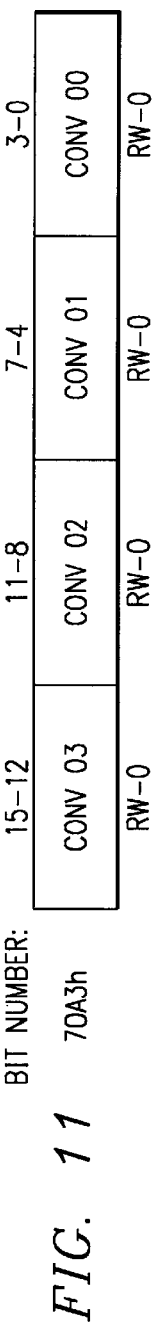
FIG. 11 illustrates one of four channel select control registers for the ADC.

FIG. 11 illustrates one of four channel select control registers for the ADC. Channel select sequencing (CHSELSEQ) control registers 201, 206, respectively each include two of these registers so that eight channel selection entries can be stored. Each of the four-bit fields, Convnn, selects any one of the sixteen muxed analog input ADC channels.

Figure 12:
FIG. 12 illustrates one of sixteen ADC conversion result buffer registers of the ADC.

FIG. 12 illustrates one of sixteen ADC conversion result buffer registers 260(0–15) of the ADC. The buffer registers are memory mapped at addresses 70A8h–70B7h. The 10-bit conversion result (D9–D0) is left justified. Table 11 identifies which conversion result is stored in each result register.

TABLE 11

Conversion Results Stored in Each Result Register

| Buffer Register | ADC Conversion result Buffer 8 state Sequencers | ADC Conversion result Buffer Cascaded Sequencers |
|---|---|---|
| RESULT0 | 1st Conv (Seq 1) | 1st Conv |
| RESULT1 | 2nd Conv (Seq 1) | 2nd Conv |

TABLE 11-continued

Conversion Results Stored in Each Result Register

| Buffer Register | ADC Conversion result Buffer 8 state Sequencers | ADC Conversion result Buffer Cascaded Sequencers |
|---|---|---|
| RESULT2 | 3$^{rd}$ Conv (Seq 1) | 3$^{rd}$ Conv |
| RESULT3 | 4$^{th}$ Conv (Seq 1) | 4$^{th}$ Conv |
| RESULT4 | 5$^{th}$ Conv (Seq 1) | 5$^{th}$ Conv |
| RESULT5 | 6$^{th}$ Conv (Seq 1) | 6$^{th}$ Conv |
| RESULT6 | 7$^{th}$ Conv (Seq 1) | 7$^{th}$ Conv |
| RESULT7 | 8$^{th}$ Conv (Seq 1) | 8$^{th}$ Conv |
| RESULT8 | 1$^{st}$ Conv (Seq 2) | 9$^{th}$ Conv |
| RESULT9 | 2$^{nd}$ Conv (Seq 2) | 10$^{th}$ Conv |
| RESULT10 | 3$^{rd}$ Conv (Seq 2) | 11$^{th}$ Conv |
| RESULT11 | 4$^{th}$ Conv (Seq 2) | 12$^{th}$ Conv |
| RESULT12 | 5$^{th}$ Conv (Seq 2) | 13$^{th}$ Conv |
| RESULT13 | 6$^{th}$ Conv (Seq 2) | 14$^{th}$ Conv |
| RESULT14 | 7$^{th}$ Conv (Seq 2) | 15$^{th}$ Conv |
| RESULT15 | 8$^{th}$ Conv (Seq 2) | 16$^{th}$ Conv |

Figure 13:
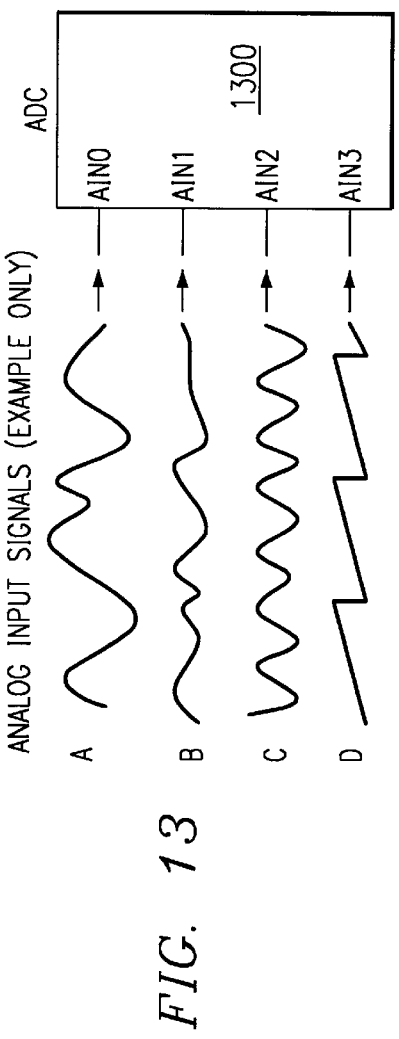
FIG. 13 is a block diagram illustrating an auto-sequenced ADC sampling four analog signals via multiplexed inputs.

FIG. 13 is a block diagram illustrating auto-sequenced ADC 1300 sampling four analog signals via multiplexed inputs. ADC 1300 embodiment of the present having only four analog input channels; however, ADCs with a greater or fewer number of channels and states can embody aspects of the present invention. With the ability to arbitrarily select any input channel at each Convnn state, various sampling options can be realized, depending on the resolution requirement of each input signal. The more times a given signal is repeatedly sampled (over-sampled) the higher can be the effective conversion resolution. Although not in the scope of this description, higher resolution of a digitized signal can be achieved by appropriate "post processing" of the converted results in software executing on DSP core 102, for example. Table 12 gives some possible sampling options based on a 4 channel, 16 state Auto-sequencer.

TABLE 12

Example of Some Sampling Options.
(Note: Convnn are 2-bit entries, x = don't care)

| Comment | Convnn | | | | | | | | | | | | | | | |
|---|---|---|---|---|---|---|---|---|---|---|---|---|---|---|---|---|
| | 00 | 01 | 02 | 03 | 04 | 05 | 06 | 07 | 08 | 09 | 10 | 11 | 12 | 13 | 14 | 15 |
| 1 | A | B | C | D | x | x | x | x | x | x | x | x | x | x | x | x |
| 2 | A | A | A | A | B | B | B | B | C | C | C | C | D | D | D | D |
| 3 | A | B | C | D | A | B | C | D | A | B | C | D | A | B | C | D |
| 4 | A | A | A | A | A | A | A | A | B | B | C | C | D | D | x | x |
| 5 | A | A | A | A | A | A | A | A | A | A | A | A | A | B | C | D |

In Table 12, line 1 represents regular sampling of 4 channels, i.e. one sample each with minimal skew between channels.

Line 2 represents each channel (A, B, C, D) oversampled by 4 times.

Channel skew is 4x of previous case. Effective resolution of ADC increased (same for all 4 channels).

Line 3 represents each channel (A, B, C, D) oversampled by 4 times. Channel skew is minimized. Effective resolution of the ADC increased (same for all 4 channels).

Line 4 represents Channel A being oversampled by 8 times, Channels B,C & D are oversampled by 2 times. Here channel A is requirement to be measured with greater resolution than B,C or D.

Line 5 represents Channel A being oversampled by 13 times, Channels B,C & D are sampled once only.

Advantageously, with a flexible auto-sequenced ADC sequencer according to the present invention, many different sampling algorithms may be easily implemented under control of software being executed on an associated microprocessor.

Figure 14:
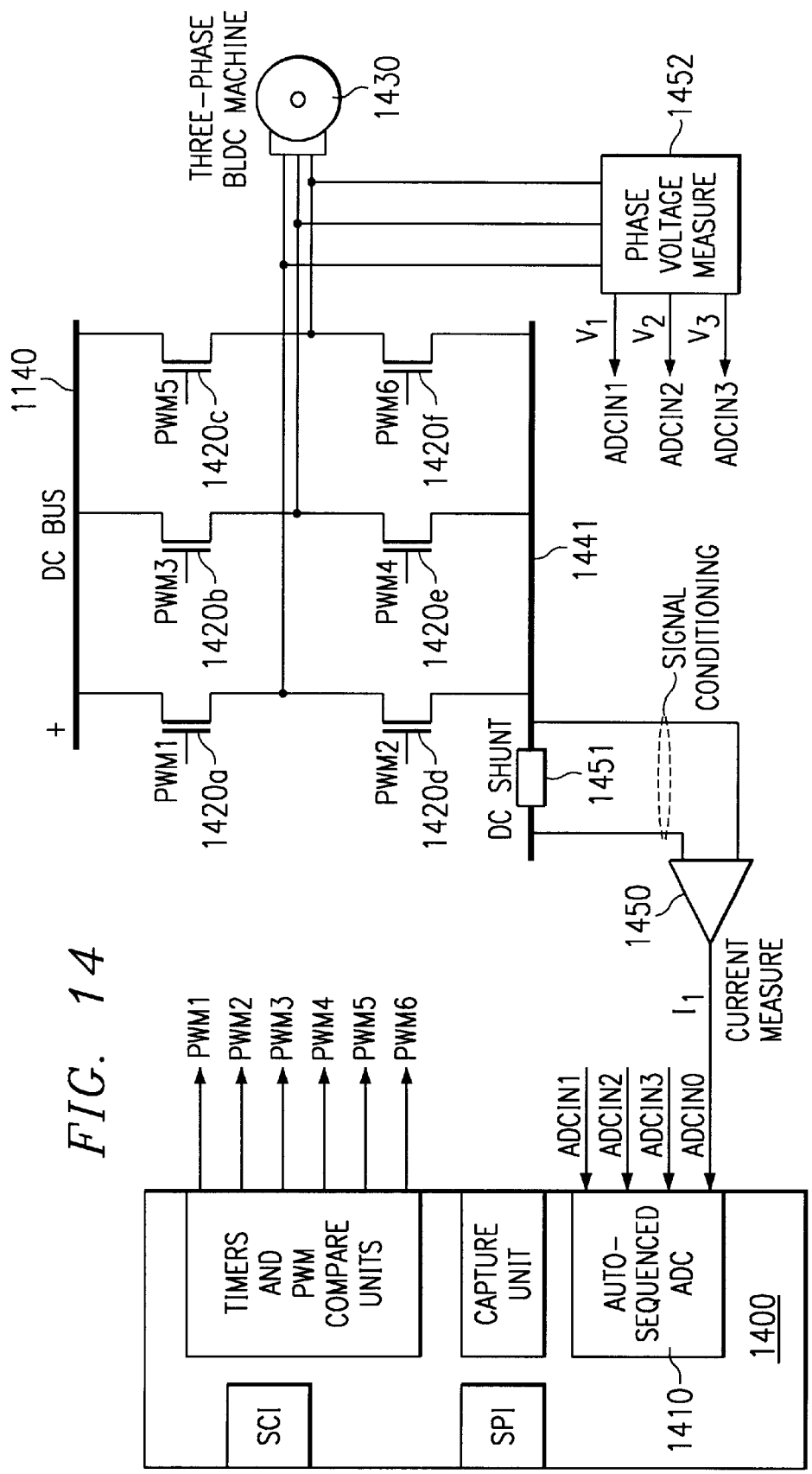
FIG. 14 is a block diagram illustrating the digital system of FIG. 1 configured as a digital motor controller using an auto-sequenced ADC.

FIG. 14 is a block diagram illustrating the digital system 1400 configured as a digital motor controller using auto-sequenced ADC 1410. Control devices 1420(a–f) are turned on an off in an alternating manner in response to signals PWM(1–5) provided by motor control system 1400. A three phase motor 1430 is thus supplied with three phase alternating current from a DC power bus 1440, 1441.

The system requires measurement of four analog signals, i.e. three voltages ($V_1$, $V_2$, $V_3$) and one Current ($I_1$). Current sensing is provided by opamp 1450 measuring a voltage drop across shunt 1451. Voltage is measured by voltage measuring circuitry 1452. The ADC resolution requirements vary from system to system. For this particular example the current measurement has a higher resolution requirement, and hence can benefit from an oversampling technique. Since the ADC core has a fixed resolution converter, the sampling strategy of Table 13 with 13x oversampling on current offers a higher resolution current measurement.

TABLE 13

Over-Sampling Strategy to Increase
Effective Resolution of Current Measurement

| Convnn | | | | | | | | | | | | | | | | |
|---|---|---|---|---|---|---|---|---|---|---|---|---|---|---|---|---|
| 00 | 01 | 02 | 03 | 04 | 05 | 06 | 07 | 08 | 09 | 10 | 11 | 12 | 13 | 14 | 15 |
| $I_1$ | $I_1$ | $I_1$ | $I_1$ | $I_1$ | $I_1$ | $I_1$ | $I_1$ | $I_1$ | $I_1$ | $I_1$ | $I_1$ | $I_1$ | $V_1$ | $V_2$ | $V_3$ |

In this case with an appropriate Over-sampling algorithm, such as for example with Triangular dithering, one can achieve a theoretical improvement of 2.5 bits resolution above the existing ADC resolution.

Fabrication of digital system 100 involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

Digital system 100 contains hardware extensions for advanced debugging features. These assist in the development of an application system. Since these capabilities are part of the core of CPU 102 itself, they are available utilizing only the JTAG interface with extended operating mode extensions. They provide simple, inexpensive, and speed independent access to the core for sophisticated debugging and economical system development, without requiring the costly cabling and access to processor pins required by traditional emulator systems or intruding on system resources.

Thus, a digital system is provided with an analog to digital converter having a given accuracy, such as ten bits, for example. The ADC has a configurable sequencing that allows a programmable number of Auto conversions to occur on two separate and independent, but cascadeable, sequencers (or state machines). For each conversion state, the sequencer/s can be programmed to arbitrarily select any one of a set of muxed analog input channels. In addition, each conversion state has a unique result register in which the converted value is placed at completion of conversion. This auto-sequenced ADC control system gives the capability to set up various forms of input signal sampling strategies. For example, one such strategy samples and converts the same channel multiple times allowing an oversampling algorithm to be easily performed. By over sampling, increased resolution over traditional single sampled conversion systems can be obtained by suitable processing of the over-sampled results. Using triangular dithering, the accuracy of a ten-bit ADC can be increased to 12.5 bits, for example.

Advantageously, a system including an aspect of the present invention can provide arbitrary selection of any input channel with results stored sequentially in Result regs.

Advantageously, a variable and programmable number of sequenced states, up to a maximum, can be configured.

Advantageously, triggered start of each sequencer operation can be selected under control of software.

Advantageously, either dual sequence operation or cascaded sequence operation can be selected under control of software, so that the ADC can move between the two modes of operation as needed.

Advantageously, arbitration capability is provided between Sequencer 1 & 2.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

While the invention has been described with reference to illustrative embodiments, this description is not intended to be construed in a limiting sense. Various other embodiments of the invention will be apparent to persons skilled in the art upon reference to this description. For example, a different number of sequencers and/or states may be implemented. Different numbers, likewise, of analog input terminals may be embodied.

It is therefore contemplated that the appended claims will cover any such modifications of the embodiments as fall within the true scope and spirit of the invention.

What is claimed is:

1. A digital system, comprising:
   an analog to digital converter (ADC) with input multiplexor circuitry having a plurality of analog input terminals for receiving a plurality of analog signals, the input multiplexor being responsive to a select input;
   a first sequence state machine controllably connected to the input multiplexor select input, the first sequence state machine comprising a first number of programmable states, the first sequence state machine operable to auto-sequence a series of conversions by the ADC, wherein each of the programmable states is programmed to select any one of the plurality of analog input terminals; and
   a second sequence state machine controllably connected to the input multiplexor select input, the second sequence state machine comprising a second number of programmable states, the second sequence state machine operable to auto-sequence another series of conversions by the ADC, wherein each of the programmable states of the second sequence state machine is programmed to select any one of the plurality of analog input terminals.

2. The digital system of claim 1, further comprising a first number of result registers connected to an output of the ADC, each result register operable to receive a conversion result from the ADC corresponding to a respective state of the first sequence state machine.

3. The digital system of claim 1, wherein the first sequence state machine further comprises a programmable register for specifying a maximum number of states for a series of conversions by the ADC, wherein the maximum number of states is selectable and is less than or equal to the first number of programmable states.

4. The digital system of claim 1, wherein the first sequence state machine has a first trigger input, and wherein the first sequence state machine is operable to auto-sequence a series of conversions by the ADC in response to receiving a trigger signal on the first trigger input.

5. The digital system of claim 1, wherein the second sequence state machine has a second trigger input, and wherein the second sequence state machine is operable to operable to auto-sequence a series of conversions by the ADC in response to receiving a trigger signal on the second trigger input.

6. The digital system of claim 5, further comprising arbitration circuitry connected to the first sequence state machine and to the second sequence state machine, the arbitration circuitry operable to enable either the first sequence state machine or the second sequence state machine to control the ADC.

7. The digital system of claim 1, further comprising mode control circuitry connected to the first sequence state machine and to the second sequence state machine, the mode control circuitry operable to select a cascade mode of operation, wherein the second sequence state machine is enabled to operate in a cascade manner with the first sequence state machine.

8. A method of operating an analog to digital converter (ADC) with input multiplexor circuitry having a plurality of analog input terminals for receiving a plurality of analog signals, comprising the steps of:

1) programming a first plurality of states with a respective selector value, where each selector value specifies any one of the plurality of analog input terminals;

2) programming a different second plurality of states with a respective selector value, where each selector value specifies any one of the plurality of analog input terminals;

3) receiving a plurality of analog signals on respective ones of the plurality of analog input terminals;

4) accessing each state of the first plurality of states in a sequential manner and selecting an analog input terminal specified by a selector value contained therein in response to a first trigger;

5) accessing each state of the second plurality of states in a sequential manner and selecting an analog input terminal specified by a selector value contained therein in response to a second trigger; and 6) performing an analog to digital conversion on selected ones of the plurality of analog signals in accordance with the selector value contained in each state.

9. The method of claim 8, wherein during step 1 a same selector value is programmed in more than one of the first plurality of states.

10. The method of claim 8, wherein step 4 is performed before step 5 if the first trigger stimulus is received before the second trigger stimulus, or step 5 is performed before step 4 if the second trigger stimulus is received before the first trigger stimulus.

11. The method of claim 8, further comprising the step of specifying a maximum number of states, wherein the maximum number of states is selectable and is less than or equal to the first number of programmable states, such that during step 4 only the maximum number of states of the first plurality of states is accessed.

* * * * *